US012796570B2

(12) United States Patent
Kang

(10) Patent No.: US 12,796,570 B2
(45) Date of Patent: Nov. 10, 2026

(54) SEMICONDUCTOR PACKAGE

(71) Applicant: Samsung Electronics Co., Ltd., Suwon-si (KR)

(72) Inventor: Myungsam Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 256 days.

(21) Appl. No.: 18/617,896

(22) Filed: Mar. 27, 2024

(65) Prior Publication Data

US 2025/0087637 A1 Mar. 13, 2025

(30) Foreign Application Priority Data

Sep. 12, 2023 (KR) ........................ 10-2023-0120878

(51) Int. Cl.
*H10W 90/00* (2026.01)
*H10W 44/00* (2026.01)
(Continued)

(52) U.S. Cl.
CPC ......... *H10W 90/00* (2026.01); *H10W 44/601* (2026.01); *H10W 70/60* (2026.01); *H10W 70/611* (2026.01); *H10W 70/65* (2026.01); *H10W 70/68* (2026.01); *H10W 70/685* (2026.01); *H10W 70/692* (2026.01);
(Continued)

(58) Field of Classification Search
CPC ... H10W 90/00; H10W 44/601; H10W 70/60; H10W 70/611; H10W 70/65; H10W 70/68; H10W 70/685; H10W 70/692; H10W 40/22; H10W 90/724; H10W 90/401; H10W 74/00–481; H10W 70/00–699; H10W 70/616–618; H10P 14/2922
See application file for complete search history.

(56) References Cited

U.S. PATENT DOCUMENTS

| | | | |
|---|---|---|---|
| 10,074,630 | B2 | 9/2018 | Kelly et al. |
| 10,483,156 | B2 | 11/2019 | Leobandung |

(Continued)

FOREIGN PATENT DOCUMENTS

| | | | |
|---|---|---|---|
| CN | 114937609 A | 8/2022 |
| CN | 218647928 U | 3/2023 |
| KR | 10-2022-0060557 A | 5/2022 |

*Primary Examiner* — Shahed Ahmed
(74) *Attorney, Agent, or Firm* — HARNESS, DICKEY & PIERCE, P.L.C.

(57) ABSTRACT

A semiconductor package includes a redistribution substrate, a glass substrate mounted on the redistribution substrate and including a cavity in a central portion of the glass substrate, a bridge die in the cavity, a first semiconductor chip and a second semiconductor chip, the first semiconductor chip and the second semiconductor chip side by side, on the glass substrate, and the first semiconductor chip and the second semiconductor chip on the bridge die, a mold layer covering a top surface of the redistribution substrate, the glass substrate, the bridge die, the first semiconductor chip and the second semiconductor chip, and internal connection terminals connecting the glass substrate and the bridge die to the first and second semiconductor chips. The glass substrate includes a plurality of connection vias. A distance between an outer side surface of the glass substrate and a side surface of the mold layer ranges from 30 μm to 500 μm.

20 Claims, 15 Drawing Sheets

(51) Int. Cl.

| | |
|---|---|
| ***H10W 70/60*** | (2026.01) |
| ***H10W 70/65*** | (2026.01) |
| ***H10W 70/68*** | (2026.01) |
| ***H10W 70/685*** | (2026.01) |
| ***H10W 70/692*** | (2026.01) |
| ***H10W 74/10*** | (2026.01) |
| *H10W 40/22* | (2026.01) |

(52) U.S. Cl.

CPC .......... *H10W 74/121* (2026.01); *H10W 40/22* (2026.01); *H10W 90/724* (2026.01); *H10W 90/728* (2026.01)

(56) References Cited

U.S. PATENT DOCUMENTS

| | | | | |
|---|---|---|---|---|
| 11,355,438 | B2 | 6/2022 | Pietambaram et al. | |
| 11,494,682 | B2 | 11/2022 | Elsherbini et al. | |
| 11,652,039 | B2 | 5/2023 | Kim et al. | |
| 2019/0131273 | A1* | 5/2019 | Chen | H10P 72/74 |
| 2020/0395313 | A1 | 12/2020 | Mallik et al. | |
| 2021/0074600 | A1* | 3/2021 | Jeng | H10W 70/635 |
| 2021/0305132 | A1 | 9/2021 | Karhade et al. | |
| 2021/0391263 | A1 | 12/2021 | Nie et al. | |
| 2023/0084379 | A1 | 3/2023 | Duan et al. | |
| 2023/0087838 | A1 | 3/2023 | Manepalli et al. | |
| 2023/0282634 | A1* | 9/2023 | Enquist | H10F 39/809 257/690 |
| 2023/0335478 | A1 | 10/2023 | Lin et al. | |
| 2024/0063127 | A1* | 2/2024 | Ecton | H10W 70/65 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0120878, filed on Sep. 12, 2023, in the Korean Intellectual Property Office, the entire contents of which are hereby incorporated by reference.

BACKGROUND

The present disclosure relates to semiconductor packages.

An integrated circuit chip may be realized in the form of a semiconductor package so as to be appropriately applied to an electronic product. In a typical semiconductor package, a semiconductor die may be mounted on a printed circuit board (PCB) and may be electrically connected to the printed circuit board (PCB) through bonding wires or bumps. Various techniques for improving reliability and durability of semiconductor packages have been studied with the development of an electronic industry.

SUMMARY

Example embodiments of the inventive concepts may provide a semiconductor package with improved durability and reliability.

In an aspect, a semiconductor package may include a redistribution substrate; a glass substrate mounted on the redistribution substrate and a cavity defined in a central portion of the glass substrate; a bridge die in the cavity; a first semiconductor chip and a second semiconductor chip, the first semiconductor chip and the second semiconductor chip are side by side, on the glass substrate, and the first semiconductor chip and the second semiconductor chip on the bridge die; a mold layer covering a top surface of the redistribution substrate, the glass substrate, the bridge die, the first semiconductor chip, and the second semiconductor chip; and internal connection terminals connecting the glass substrate and the bridge die to the first and second semiconductor chips. The glass substrate includes a plurality of connection vias. A distance between an outer side surface of the glass substrate and a side surface of the mold layer ranges from 30 μm to 500 μm.

In an aspect, a semiconductor package may include a redistribution substrate including, a plurality of redistribution insulating layers sequentially stacked, and redistribution patterns between the redistribution insulating layers; a glass substrate mounted on the redistribution substrate and defining a cavity in a central portion of the glass substrate; a bridge die in the cavity; a first semiconductor chip and a second semiconductor chip, the first semiconductor chip and the second semiconductor chip are side by side, on the glass substrate, and the first semiconductor chip and the second semiconductor chip on the bridge die; silicon capacitors between the glass substrate and the bridge die, and the silicon capacitors connected to bottom surfaces of the first and second semiconductor chips; a mold layer covering a top surface of the redistribution substrate, the glass substrate, the bridge die, the silicon capacitors, the first semiconductor chip and the second semiconductor chip; and internal connection terminals connecting the glass substrate, the bridge die and the silicon capacitors to the first and second semiconductor chips. The glass substrate includes first connection vias. A distance between an outer side surface of the glass substrate and a side surface of the mold layer ranges from 30 μm to 500 μm. A thickness of the glass substrate ranges from 50 μm to 500 μm. A diameter of the first connection vias ranges from 5 μm to 50 μm. A distance between the first connection vias ranges from 5 μm to 50 μm. The glass substrate has a thermal expansion coefficient lower than that of the mold layer. The glass substrate has a rigidity higher than that of the mold layer.

In an aspect, a semiconductor package may include a first substrate; a redistribution substrate on the first substrate; a glass substrate on the redistribution substrate and defining a cavity in a central portion of the glass substrate; a bridge die in the cavity; a first semiconductor chip and a second semiconductor chip, the first semiconductor chip and the second semiconductor chip are side by side, on the glass substrate, and the first semiconductor chip and the second semiconductor chip on the bridge die; a mold layer covering a top surface of the redistribution substrate, the glass substrate, the bridge die, the first semiconductor chip and the second semiconductor chip; internal connection terminals connecting the glass substrate and the bridge die to the first and second semiconductor chips; and a heat dissipation member covering a top surface of the first substrate, the first, and second semiconductor chips and the mold layer. The redistribution substrate includes a plurality of redistribution insulating layers sequentially stacked and redistribution patterns between the redistribution insulating layers. A distance between an outer side surface of the glass substrate and a side surface of the mold layer ranges from 30 μm to 500 μm.

DETAILED DESCRIPTION

Example embodiments of the inventive concepts will now be described more fully with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
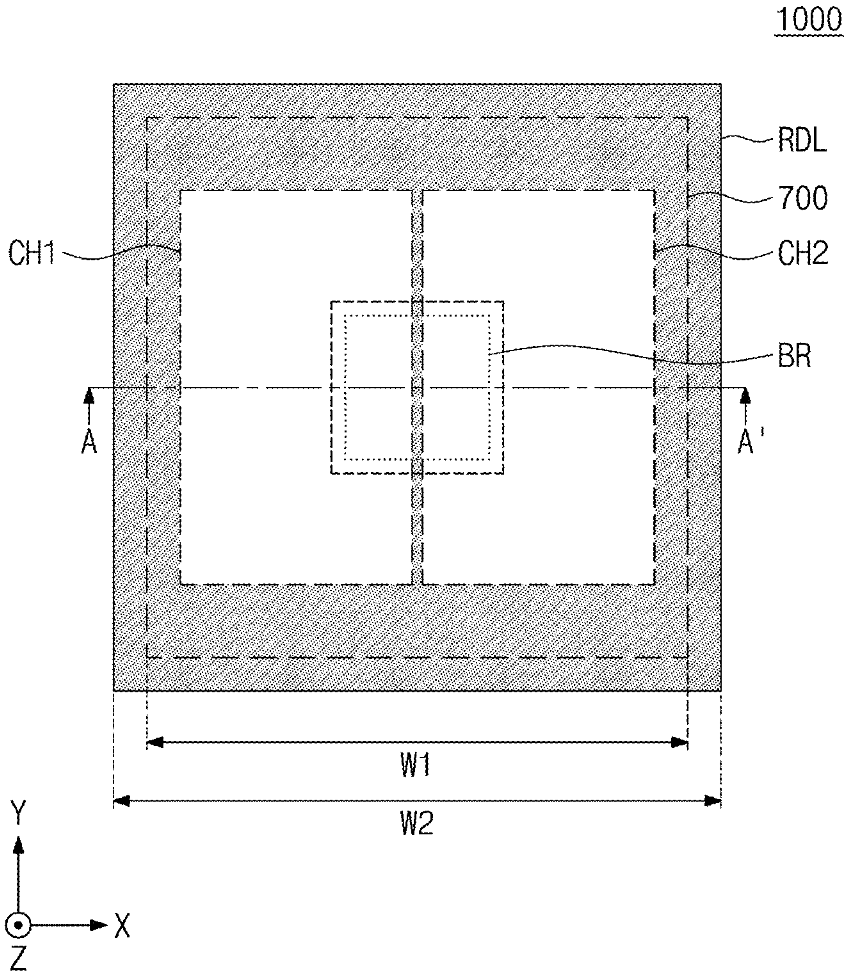
FIG. 1 is a plan view illustrating a semiconductor package according to some example embodiments of the inventive concepts.
Figure 2:
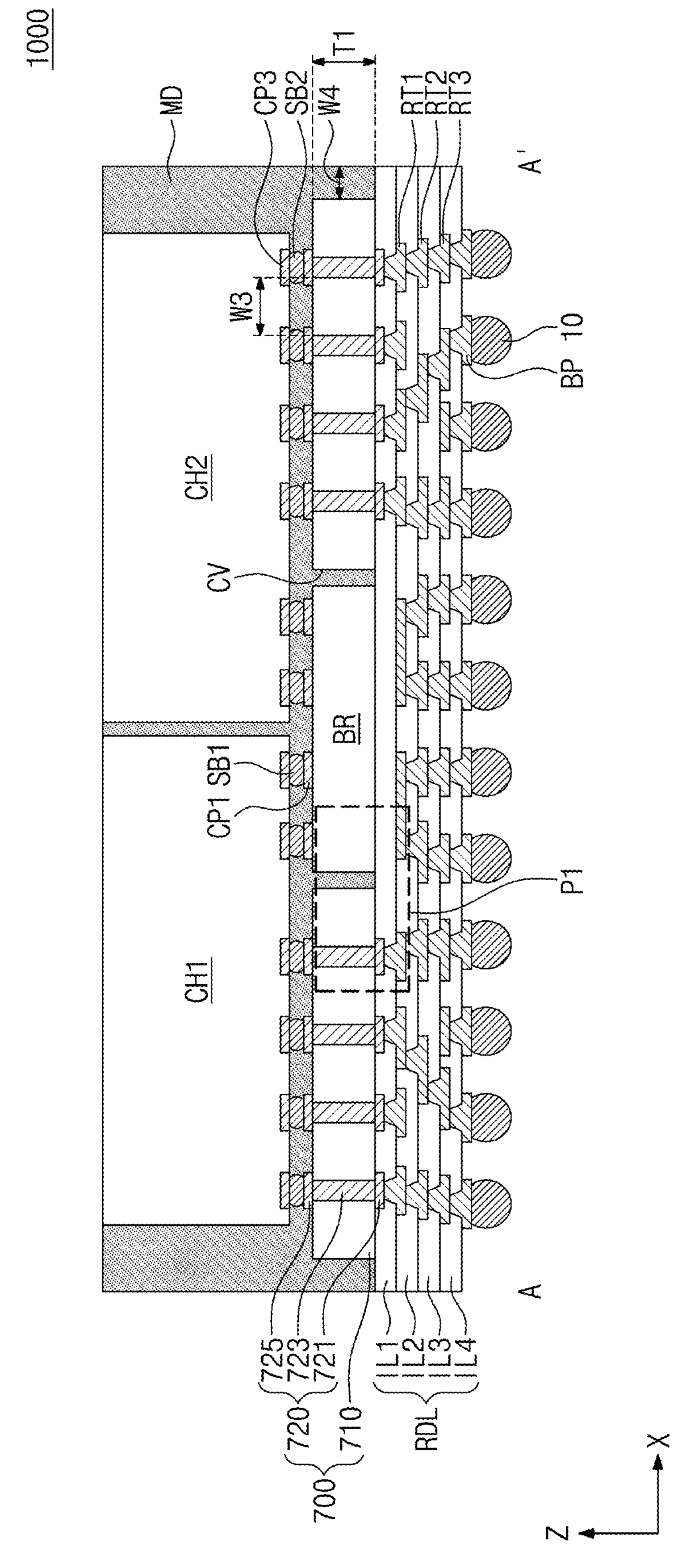
FIG. 2 is a cross-sectional view taken along a line A-A' of FIG. 1 to illustrate a semiconductor package according to some example embodiments of the inventive concepts.
Figure 3A:
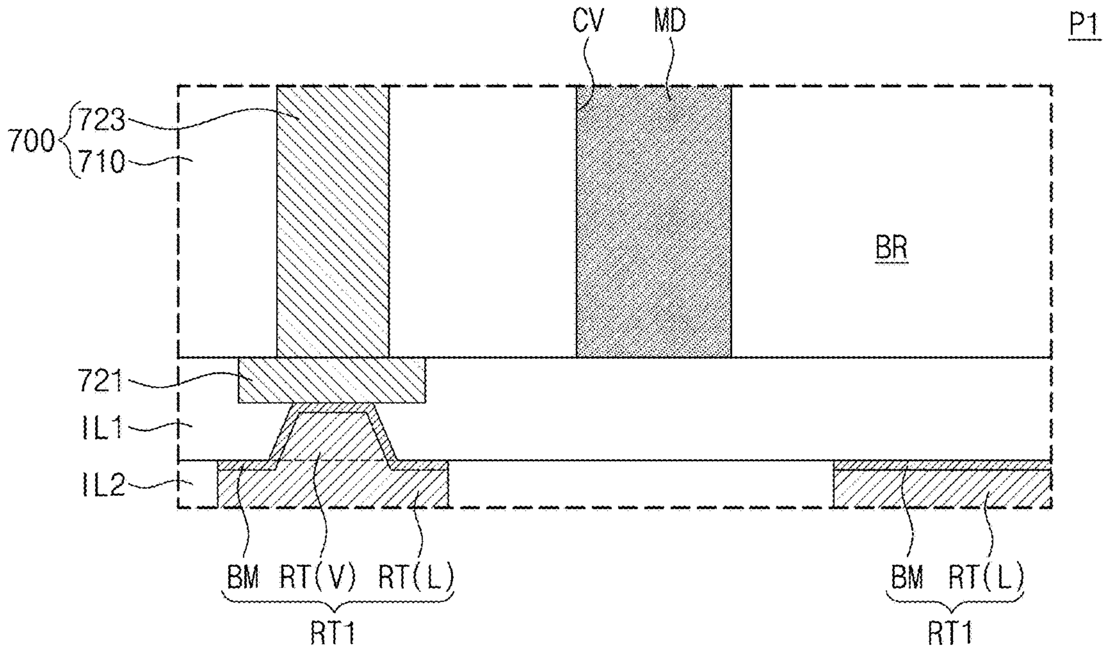
FIGS. 3A to 3C are enlarged views of a portion 'P1' of FIG. 2.
Figure 3B:
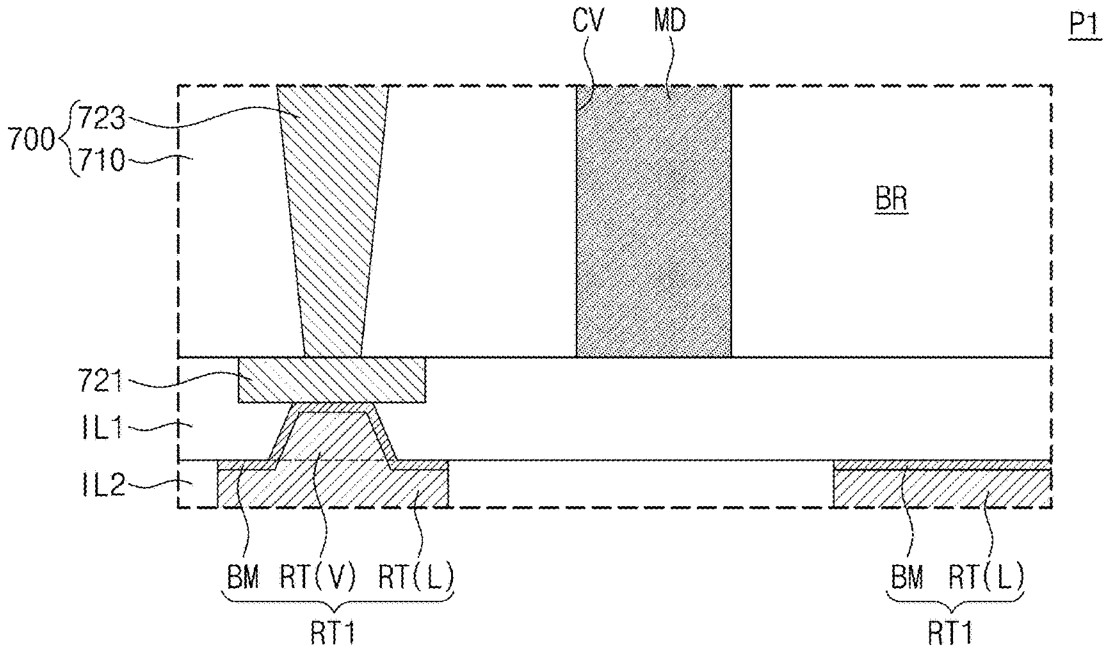
Figure 3C:
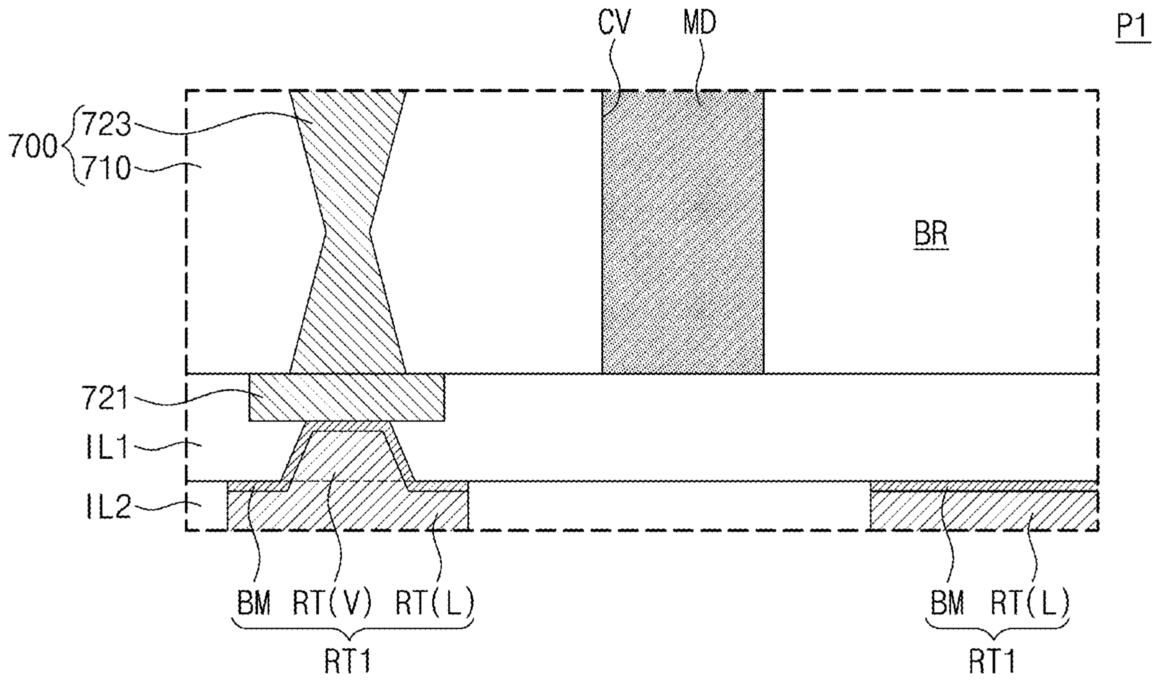

FIG. 1 is a plan view illustrating a semiconductor package according to some example embodiments of the inventive concepts. FIG. 2 is a cross-sectional view taken along a line A-A' of FIG. 1 to illustrate a semiconductor package according to some example embodiments of the inventive concepts. FIGS. 3A to 3C are enlarged views of a portion 'P1' of FIG. 2.

Referring to FIGS. 1 and 2, a semiconductor package 1000 according to the present example embodiments may have a chip-first type fan-out panel level package (FOPLP) shape. The semiconductor package 1000 may include a redistribution substrate RDL, and a glass substrate 700 and a bridge die BR which are mounted on the redistribution substrate RDL. The glass substrate 700 may have a cavity CV in its central portion and may be disposed on the redistribution substrate RDL. The bridge die BR may be disposed in the cavity CV. The glass substrate 700 may have a first width W1 in a first direction X, and the redistribution substrate RDL may have a second width W2 in the first direction X. The second width W2 may be greater than the first width W1. In the present specification, the bridge die BR may also be referred to as a semiconductor chip or an interposer substrate.

The redistribution substrate RDL may include first to fourth redistribution insulating layers IL1 to IL4, which are sequentially stacked. Each of the first to fourth redistribution insulating layers IL1 to IL4 may include a photo-imageable dielectric (PID) layer. Alternatively, each of the first to fourth redistribution insulating layers IL1 to IL4 may include a curable insulating layer (e.g., an Ajinomoto build-up film (ABF)). A first redistribution pattern RT1 may be disposed between the first redistribution insulating layer IL1 and the second redistribution insulating layer IL2. A second redistribution pattern RT2 may be disposed between the second redistribution insulating layer IL2 and the third redistribution insulating layer IL3. A third redistribution pattern RT3 may be disposed between the third redistribution insulating layer IL3 and the fourth redistribution insulating layer IL4.

Lower bonding pads BP may be disposed on a bottom surface of the fourth redistribution insulating layer IL4. The lower bonding pads BP may penetrate the fourth redistribution insulating layer IL4 so as to be in contact with the third redistribution patterns RT3. First external connection terminals 10 may be bonded to the lower bonding pads BP. Each of the first external connection terminals 10 may include at least one of a solder ball, a conductive bump, or a conductive pillar. The first external connection terminals 10 may include at least one of tin, lead, silver, copper, aluminum, gold, or nickel.

The glass substrate 700 may include a base layer 710 and a plurality of conductive structures 720. For example, the base layer 710 may include silicon oxide ($SiO_2$). The base layer 710 may not include an interconnection line. Each of the conductive structures 720 may include a lower conductive pad 721, a first connection via 723, and an upper conductive pad 725. The lower conductive pad 721 may be disposed under the first connection via 723, and the lower conductive pad 721 and the first connection via 723 may be in contact with each other. The conductive structures 720 may be electrically connected to the first to third redistribution patterns RT1 to RT3 of the redistribution substrate RDL. The conductive structures 720 may include a metal such as copper, aluminum, gold, nickel, or titanium. Each of the first connection vias 723 may have a diameter of 5 μm to 50 μm, and a distance W3 between the first connection vias 723 may range from 5 μm to 50 μm. The glass substrate 700 may have a first thickness T1 of 50 μm to 500 μm.

The bridge die BR may be a single-crystalline semiconductor substrate or a silicon-on-insulator (SOI) substrate. Even though not shown in the drawings, the bridge die BR may include a substrate, interlayer insulating layers and internal interconnection lines. The bridge die BR may not include a transistor and a connection via. For example, a thickness of the bridge die BR may range from 90% to 110% of the first thickness T1 of the glass substrate 700. In some example embodiments, the thickness of the bridge die BR may be equal to the first thickness T1 of the glass substrate 700.

A first semiconductor chip CH1 and a second semiconductor chip CH2 may be disposed side by side on the glass substrate 700 and the bridge die BR. Each of the first and second semiconductor chips CH1 and CH2 may be a single semiconductor die or semiconductor chip, or a semiconductor package including a plurality of the same kind or different kinds of semiconductor dies. Each of the first and second semiconductor chips CH1 and CH2 may include at least one of an image sensor chip (e.g., a CMOS image sensor (CIS), etc.), a memory device chip (e.g., a FLASH memory chip, a DRAM chip, a SRAM chip, an EEPROM chip, a PRAM chip, an MRAM chip, a ReRAM chip, a high bandwidth memory (HBM) chip, a hybrid memory cubic (HMC) chip, etc.), a microelectromechanical system (MEMS) device chip, or an application-specific integrated circuit (ASIC) semiconductor chip. The first and second semiconductor chips CH1 and CH2 may be the same semiconductor chips or different semiconductor chips. Even though not shown in the drawings, each of the first and second semiconductor chips CH1 and CH2 may include a substrate, interlayer insulating layers, and an integrated circuit (e.g., transistors and internal interconnection lines).

First upper chip pads CP1 may be disposed on a top surface of the bridge die BR. Second lower chip pads CP3 may be disposed on each of bottom surfaces of the first and second semiconductor chips CH1 and CH2. The chip pads CP1 and CP3 may include a metal such as copper, aluminum, gold, nickel, or titanium.

First internal connection terminals SB1 may connect the bridge die BR to the first and second semiconductor chips CH1 and CH2. The first internal connection terminals SB1 may connect the first upper chip pads CP1 to corresponding ones of the second lower chip pads CP3. Second internal connection terminals SB2 may connect the glass substrate 700 to the first and second semiconductor chips CH1 and CH2. Each of the first and second internal connection terminals SB1 and SB2 may include a solder ball or a conductive bump. Each of the first and second semiconductor chips CH1 and CH2 may be bonded to the bridge die BR and the glass substrate 700 through the first and second internal connection terminals SB1 and SB2 by a flip-chip bonding method. As a result, a redistribution layer may not be formed on the bridge die BR and the glass substrate 700, and thus a manufacturing cost of the semiconductor package 1000 may be reduced.

A mold layer MD may cover a top surface of the redistribution substrate RDL, the glass substrate 700, the bridge die BR, the first semiconductor chip CH1, and the second semiconductor chip CH2. More particularly, the mold layer MD may cover the top surface and a side surface of the bridge die BR, a top surface and inner and outer side surfaces of the glass substrate 700, the bottom surfaces and side surfaces of the first and second semiconductor chips CH1 and CH2, and the top surface of the redistribution substrate RDL. A distance W4 between the outer side surface of the glass substrate 700 and a side surface of the mold layer MD may range from 30 μm to 500 μm. Since the side surface of the glass substrate 700 is not exposed, the likelihood of a crack between the glass substrate 700 and the mold layer MD may be reduced in likelihood, minimized, or prevented. Thus, the semiconductor package 1000 with improved durability may be provided. The mold layer MD may fill a space between the glass substrate 700 and the first and second semiconductor chips CH1 and CH2, and a space between the bridge die BR and the first and second semiconductor chips CH1 and CH2. The mold layer MD may protect the first and second internal connection terminals SB1 and SB2. Top surfaces of the first and second semiconductor chips CH1 and CH2 may be coplanar with a top surface of the mold layer MD. For example, the mold layer MD may include an insulating resin such as an epoxy molding compound (EMC). The mold layer MD may further include fillers, and the fillers may be dispersed in the insulating resin.

The glass substrate 700 may have a more uniform surface due to low thickness dispersion, and thus the first and second semiconductor chips CH1 and CH2 may be easily bonded to the glass substrate 700. The glass substrate 700 may have a thermal expansion coefficient lower than that of the mold layer MD. The glass substrate 700 may have a rigidity higher than that of the mold layer MD. Thus, warpage of the semiconductor package 1000 may be reduced in likelihood or prevented to improve reliability and durability of the semiconductor package 1000.

Referring to FIGS. 3A to 3C and 2, for example, the first redistribution pattern RT1 may include a via portion RT(V) penetrating the first redistribution insulating layer IL1, and a line portion RT(L) disposed between the first and second redistribution insulating layers IL1 and IL2. Like this, each of at least some of the first to third redistribution patterns RT1 to RT3 may include the via portion RT(V) penetrating a corresponding one of the redistribution insulating layers IL1, IL2 and IL3, and the line portion RT(L) disposed between corresponding adjacent two of the redistribution insulating layers IL1, IL2 and IL3. A side surface of the via portion RT(V) may be inclined. A width of the via portion RT(V) may become progressively less from its bottom toward its top. The line portion RT(L) may have a line shape and/or a pad shape when viewed in a plan view. However, example embodiments of the inventive concepts are not limited thereto, and in certain example embodiments, at least other(s) of the first to third redistribution patterns RT1 to RT3 may not include the via portion RT(V). For example, the lower bonding pads BP and the first to third redistribution patterns RT1 to RT3 may include a metal such as copper, aluminum, gold, nickel, or titanium. A diffusion barrier layer BM may be disposed between each of the lower bonding pads BP and the first to third redistribution patterns RT1 to RT3 and a corresponding one of the redistribution insulating layers IL1, IL2, IL3 and IL4. Alternatively, each of the redistribution patterns RT1 to RT3 may include the diffusion barrier layer BM. For example, the diffusion barrier layer BM may include titanium, tantalum, titanium nitride, tantalum nitride, and/or tungsten nitride.

As shown in FIGS. 3A to 3C, the first redistribution insulating layer IL1 may be in contact with a bottom surface of the glass substrate 700. The first redistribution insulating layer IL1 may cover side surfaces of the lower conductive pads 721. The lower conductive pads 721 of the glass substrate 700 may be electrically connected to corresponding ones of the first redistribution patterns RT1. The first redistribution insulating layer IL1 may be in contact with a bottom surface of the bridge die BR. The bridge die BR may not be electrically connected to the first redistribution patterns RT1.

Referring to FIG. 3A, a side surface of the first connection via 723 may have a straight shape and may be substantially perpendicular to the bottom surface of the glass substrate 700. Referring to FIG. 3B, a side surface of the first connection via 723 may be inclined. A width of the first connection via 723 may become progressively greater from its bottom toward its top. Referring to FIG. 3C, the first connection via 723 may have a sandglass shape when viewed in a cross-sectional view. However, example embodiments of the inventive concepts are not limited thereto, and in certain example embodiments, the first connection via 723 may have one of other various shapes.

Figure 4:
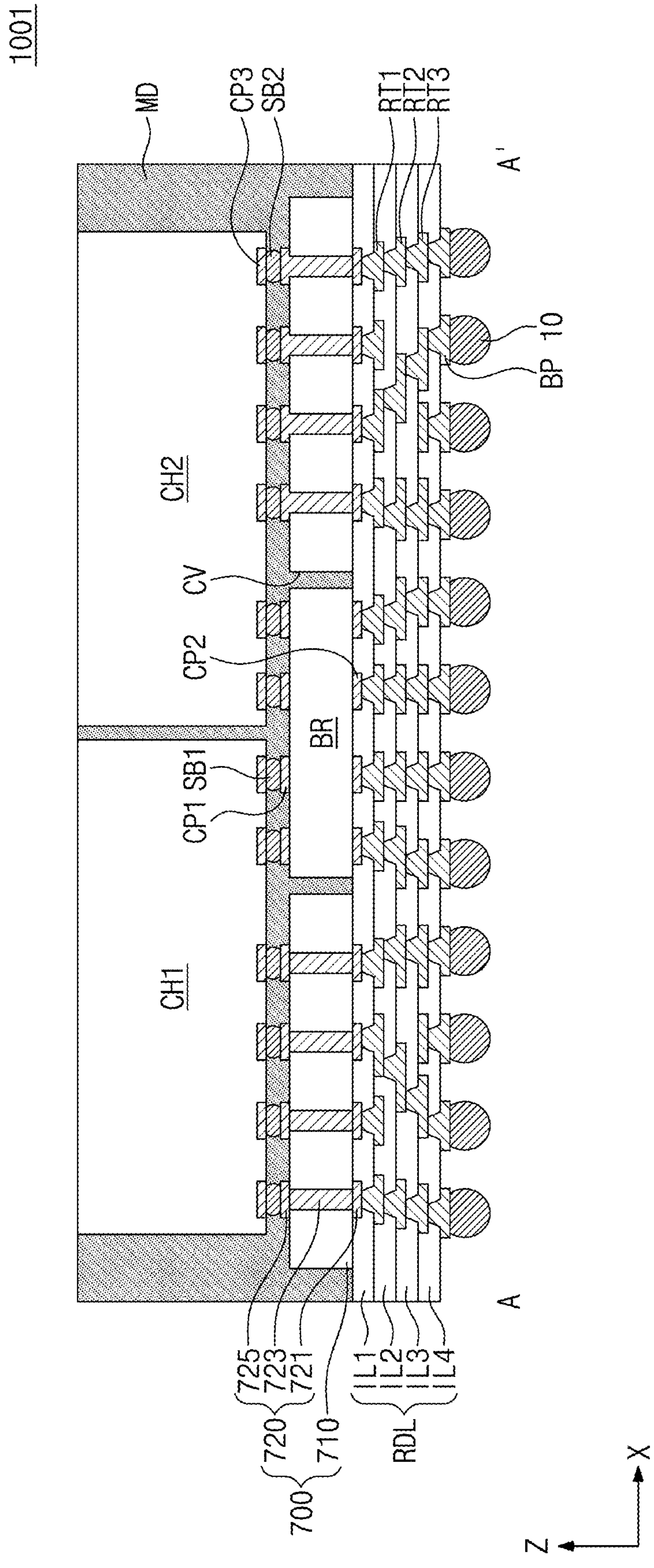
FIG. 4 is a cross-sectional view taken along the line A-A' of FIG. 1 to illustrate a semiconductor package according to some example embodiments of the inventive concepts.

FIG. 4 is a cross-sectional view taken along the line A-A' of FIG. 1 to illustrate a semiconductor package according to some example embodiments of the inventive concepts.

Referring to FIG. 4, for example, a semiconductor package 1001 may include first lower chip pads CP2 included in the bridge die BR in addition to the structure of FIG. 2. The bridge die BR may be electrically connected to corresponding ones of the first redistribution patterns RT1. Other components of the semiconductor package 1001 may be the same/similar as described with reference to FIGS. 1 to 3C.

Figure 5:
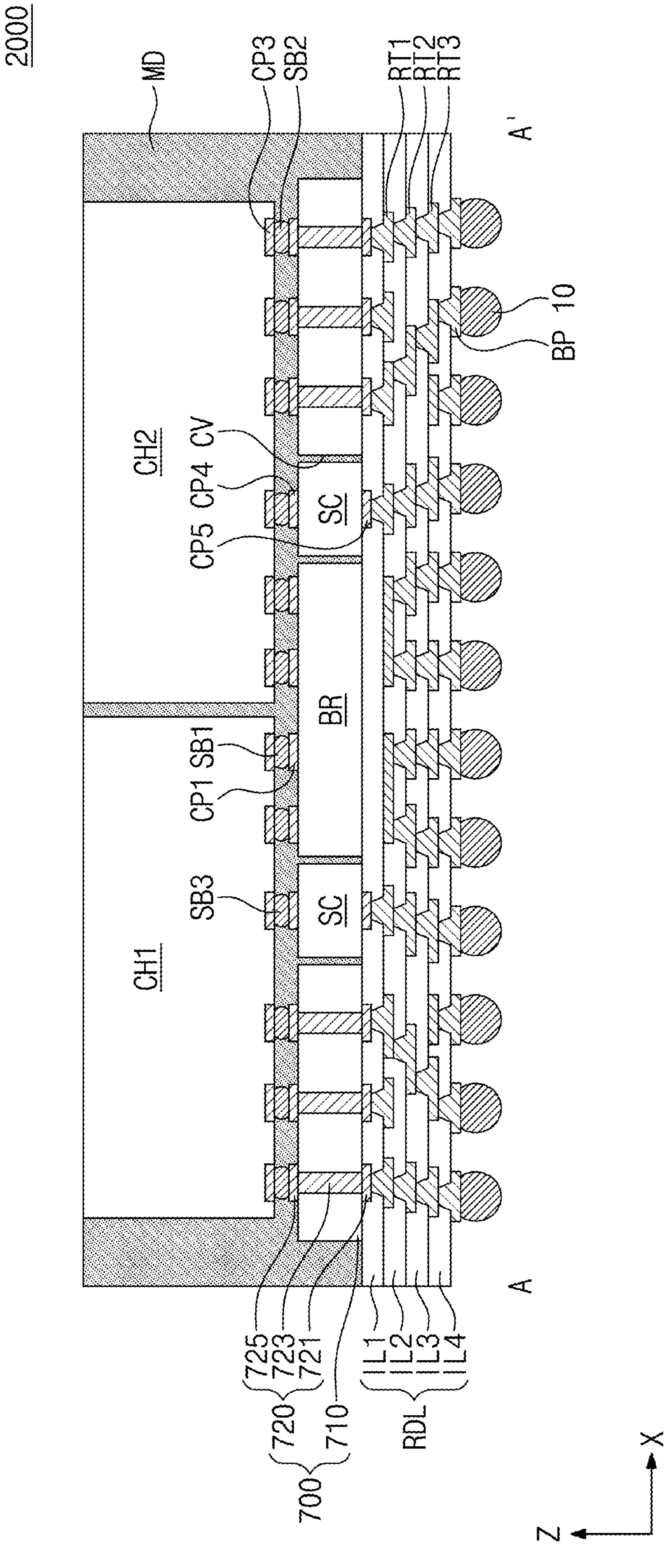
FIG. 5 is a cross-sectional view taken along the line A-A' of FIG. 1 to illustrate a semiconductor package according to some example embodiments of the inventive concepts.

FIG. 5 is a cross-sectional view taken along the line A-A' of FIG. 1 to illustrate a semiconductor package according to some example embodiments of the inventive concepts.

Referring to FIG. 5, for example, a semiconductor package 2000 may include at least one or more silicon capacitors SC disposed between the bridge die BR and the glass substrate 700 in the structure of FIG. 2. The silicon capacitors SC may be located between an outer side surface of the bridge die BR and an inner side surface of the glass substrate 700. The silicon capacitors SC may include silicon (Si). The silicon capacitors SC may include electrodes. Each of the silicon capacitors SC may include a third upper chip pad CP4 on its top surface, and a third lower chip pad CP5 on its bottom surface. The third lower chip pads CP5 may be connected to corresponding ones of the first redistribution patterns RT1. Third internal connection terminals SB3 may connect the silicon capacitors SC to the bottom surfaces of the first and second semiconductor chips CH1 and CH2, respectively. Other components of the semiconductor package 2000 may be the same/similar as described with reference to FIGS. 1 to 3C.

Figure 6:
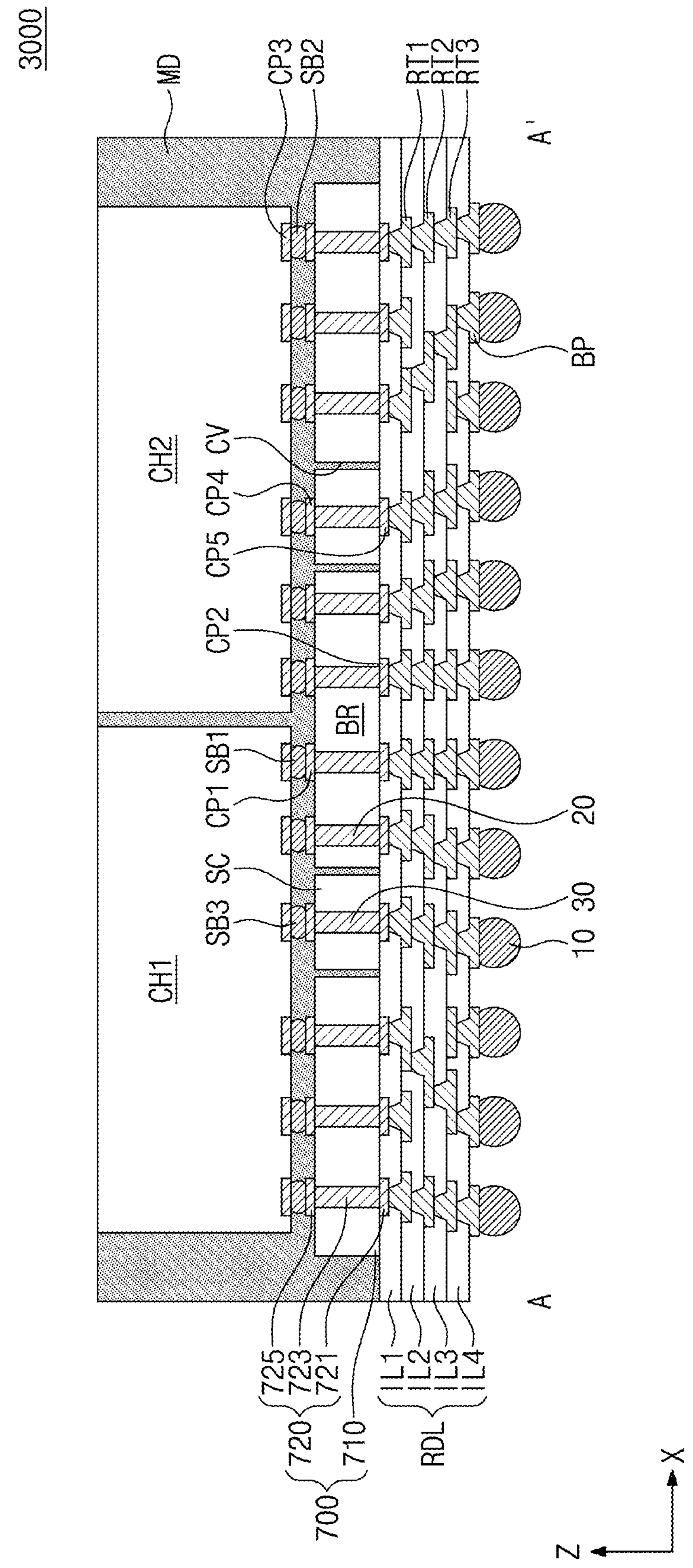
FIG. 6 is a cross-sectional view taken along the line A-A' of FIG. 1 to illustrate a semiconductor package according to some example embodiments of the inventive concepts.

FIG. 6 is a cross-sectional view taken along the line A-A' of FIG. 1 to illustrate a semiconductor package according to some example embodiments of the inventive concepts.

Referring to FIG. 6, for example, a semiconductor package 3000 may include a second connection via 20 included in the bridge die BR and a third connection via 30 included in the silicon capacitor SC in the structure of FIG. 5. The second and third connection vias 20 and 30 may be the same/similar as the first connection via 723. The bridge die BR may include the first lower chip pads CP2 on its bottom surface. The bridge die BR may be electrically connected to corresponding ones of the first redistribution patterns RT1. Other components of the semiconductor package 3000 may be the same/similar as described with reference to FIGS. 1 to 5.

FIGS. 7A to 7H are cross-sectional views illustrating a method of manufacturing the semiconductor package of FIG. 2 according to some example embodiments of the inventive concepts. Hereinafter, the descriptions to the same features as mentioned above will be omitted for the purpose of ease and convenience in explanation.

Figure 7A:
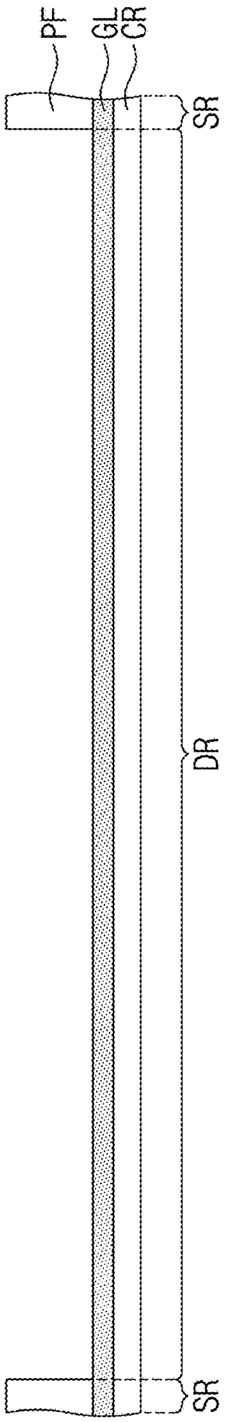
FIGS. 7A to 7H are cross-sectional views illustrating a method of manufacturing the semiconductor package of FIG. 2 according to some example embodiments of the inventive concepts.

Referring to FIG. 7A, a carrier substrate CR may be prepared. A carrier adhesive layer GL may be adhered onto the carrier substrate CR. The carrier adhesive layer GL may include an adhesive/thermosetting/thermoplastic/photo-curable resin. The carrier substrate CR may include a plurality of separation regions SR, and a chip region DR between the separation regions SR. A panel frame PF may be disposed on the carrier adhesive layer GL. The panel frame PF may be disposed to overlap with the separation regions SR and may have a shape surrounding the chip region DR in a plan view. The panel frame PF may have a grid shape when viewed in a plan view.

Figure 7B:
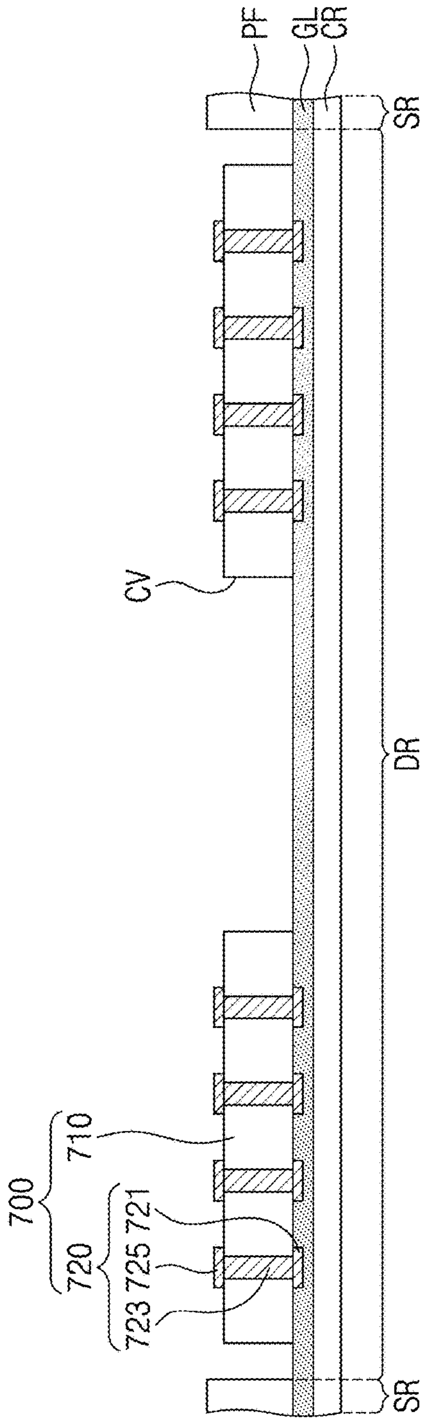

Referring to FIG. 7B, a glass substrate 700 having a cavity CV in its central portion may be prepared. The glass substrate 700 may include a base layer 710. Lower conductive pads 721 may be formed on a bottom surface of the base layer 710. The base layer 710 may be etched to form first through-holes, and a first via insulating layer (not shown) and a first connection via 723 in contact with the lower conductive pad 721 may be formed in each of the first through-holes. Upper conductive pads 725 in contact with the first connection vias 723, respectively, may be formed on a top surface of the base layer 710. Thus, a plurality of conductive structures 720 may be formed in and on the base layer 710. The glass substrate 700 may be bonded onto the carrier substrate CR in such a way that the lower conductive pads 721 face down. The glass substrate 700 may be spaced apart from the panel frame PF. The glass substrate 700 may be the same/similar as the glass substrate 700 described with reference to FIGS. 1 to 3C.

Figure 7C:
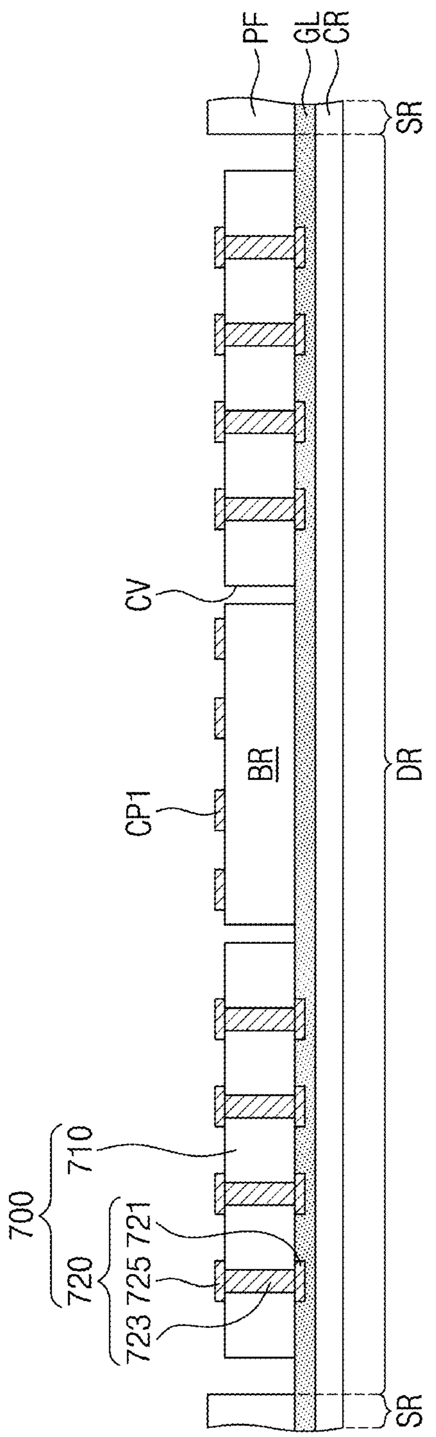

Referring to FIG. 7C, a bridge die BR may be prepared. The bridge die BR may have substantially the same thickness as the glass substrate 700. Alternatively, the thickness of the bridge die BR may range from 90% to 110% of the thickness of the glass substrate 700. The bridge die BR may be adhered in the cavity CV of the glass substrate 700. The bridge die BR may be spaced apart from the glass substrate 700. The bridge die BR may be the same/similar as the bridge die BR described with reference to FIGS. 1 to 3C.

Figure 7D:
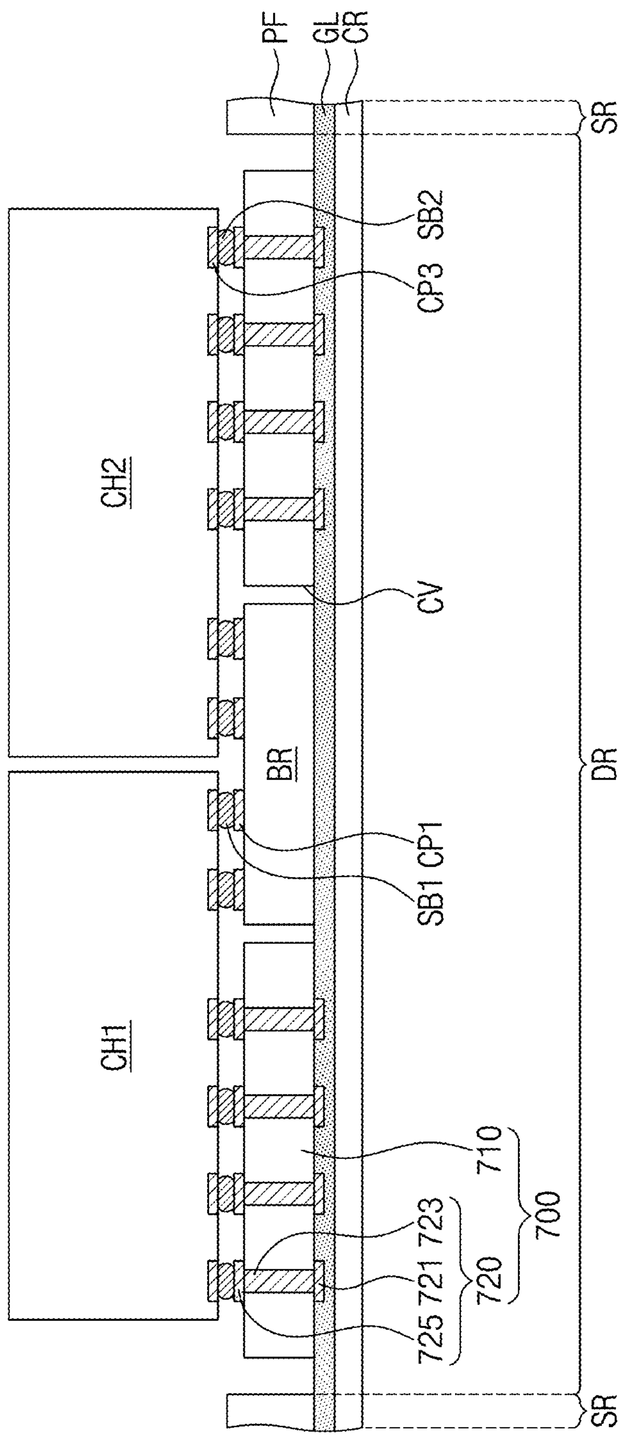

Referring to FIG. 7D, first and second semiconductor chips CH1 and CH2 may be prepared. The first and second semiconductor chips CH1 and CH2 may be the same/similar as the first and second semiconductor chips CH1 and CH2 described with reference to FIGS. 1 to 3C, respectively. The first semiconductor chip CH1 and the second semiconductor chip CH2 may have substantially equal thicknesses. Each of the first and second semiconductor chips CH1 and CH2 may be bonded onto the bridge die BR and the glass substrate 700 by a flip-chip bonding method.

Figure 7E:
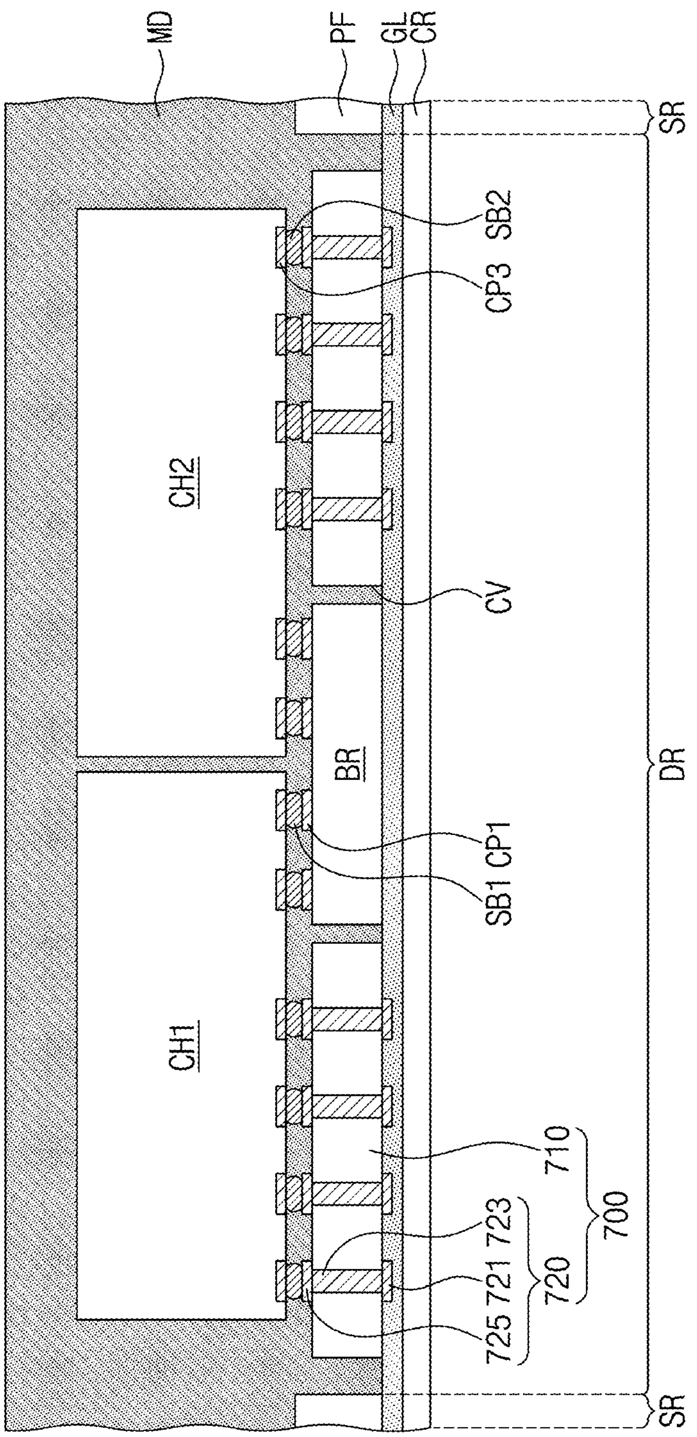

Referring to FIG. 7E, a molding process may be performed to form a mold layer MD covering a top surface and a side surface of the bridge die BR, a top surface and inner and outer side surfaces of the glass substrate 700, the first and second semiconductor chips CH1 and CH2, a top surface of the carrier adhesive layer GL, and the panel frame PF.

Figure 7F:
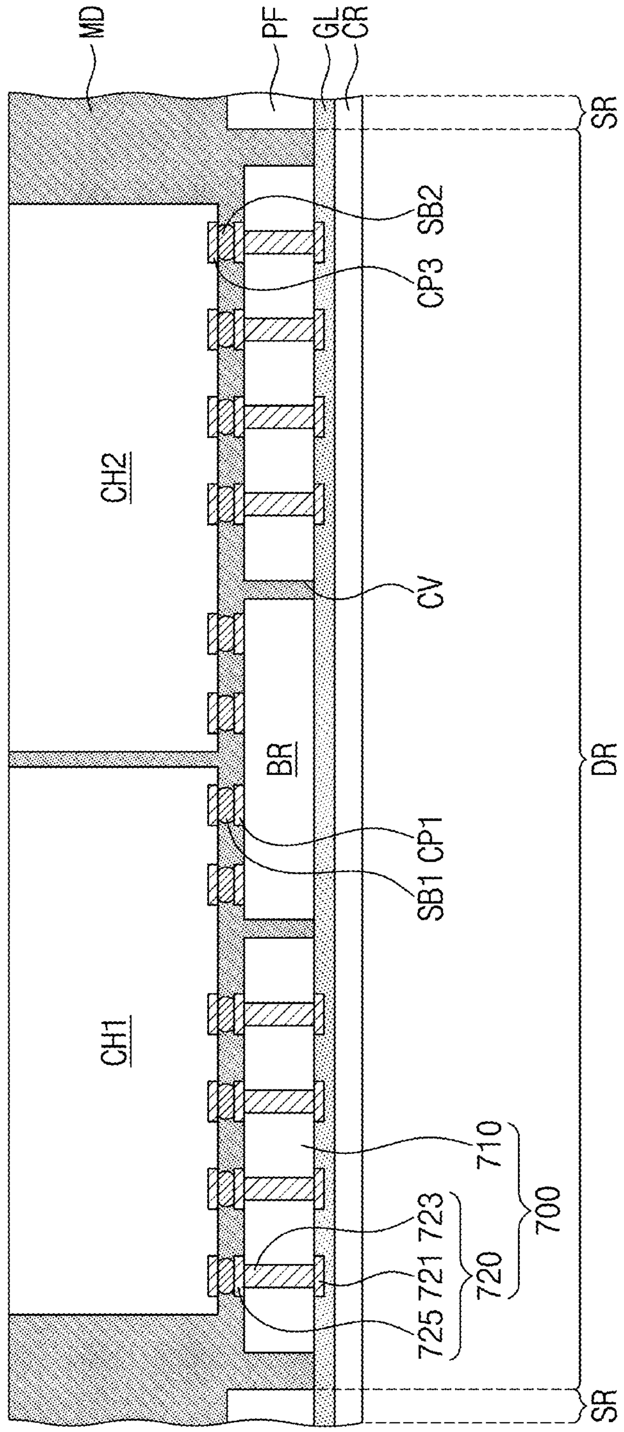

Referring to FIG. 7F, a CMP or etch-back process may be performed to remove at least a portion of the mold layer MD, and thus top surfaces of the first semiconductor chip CH1, the second semiconductor chip CH2 and the mold layer MD may be exposed.

Figure 7G:
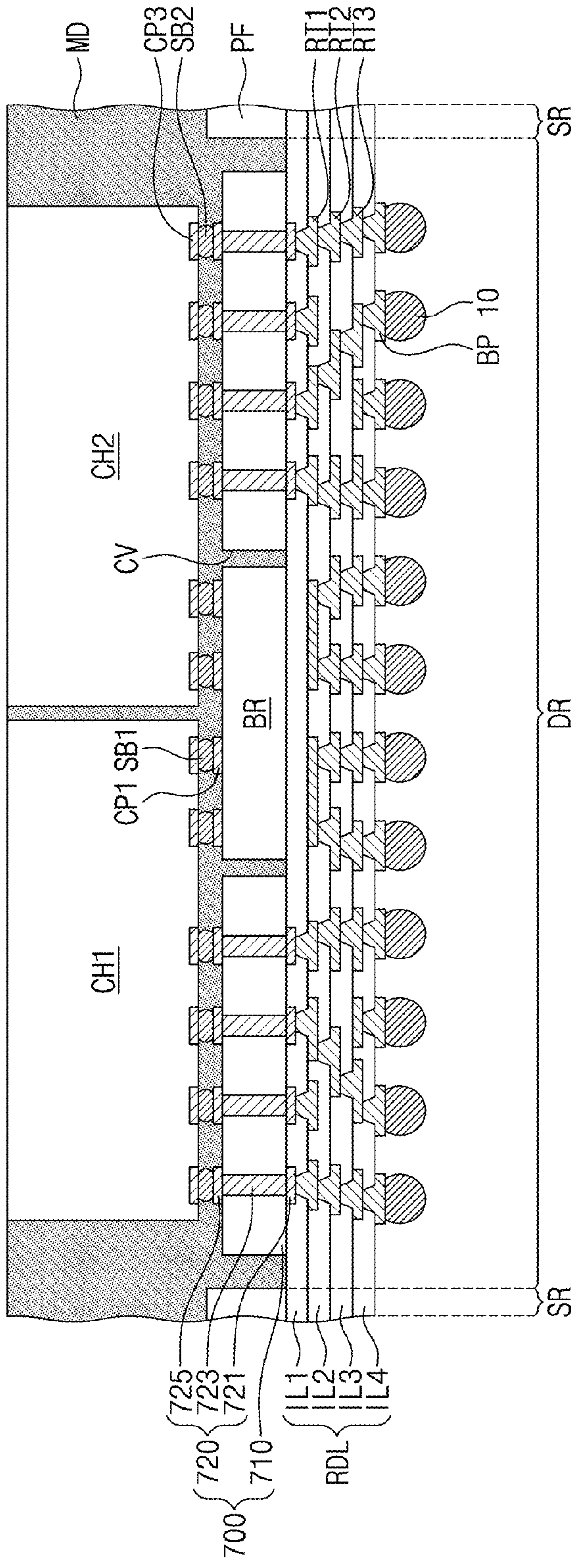

Referring to FIG. 7G, the carrier adhesive layer GL and the carrier substrate CR may be removed. Thereafter, a redistribution substrate RDL may be formed under the glass substrate 700, the bridge die BR and the mold layer MD. The redistribution substrate RDL may also include a plurality of the separation regions SR and the chip region DR therebetween. To form the redistribution substrate RDL, the structure of FIG. 7F from which the carrier adhesive layer GL and the carrier substrate CR are removed may be turned over such that bottom surfaces of the glass substrate 700, the bridge die BR and the mold layer MD face up. A first redistribution insulating layer IL1 may be formed on the glass substrate 700, the bridge die BR and the mold layer MD. The first redistribution insulating layer IL1 may be patterned to form via holes. A conductive layer may be formed on the first redistribution insulating layer IL1 to fill the via holes and may be then patterned to form first redistribution patterns RT1. These processes may be repeated to form the redistribution substrate RDL including first to fourth redistribution insulating layers IL1 to IL4, first to third redistribution patterns RT1 to RT3 and lower bonding pads BP, and then, the resultant structure may be turned over again. Subsequently, first external connection terminals 10 may be bonded to the lower bonding pads BP.

Figure 7H:
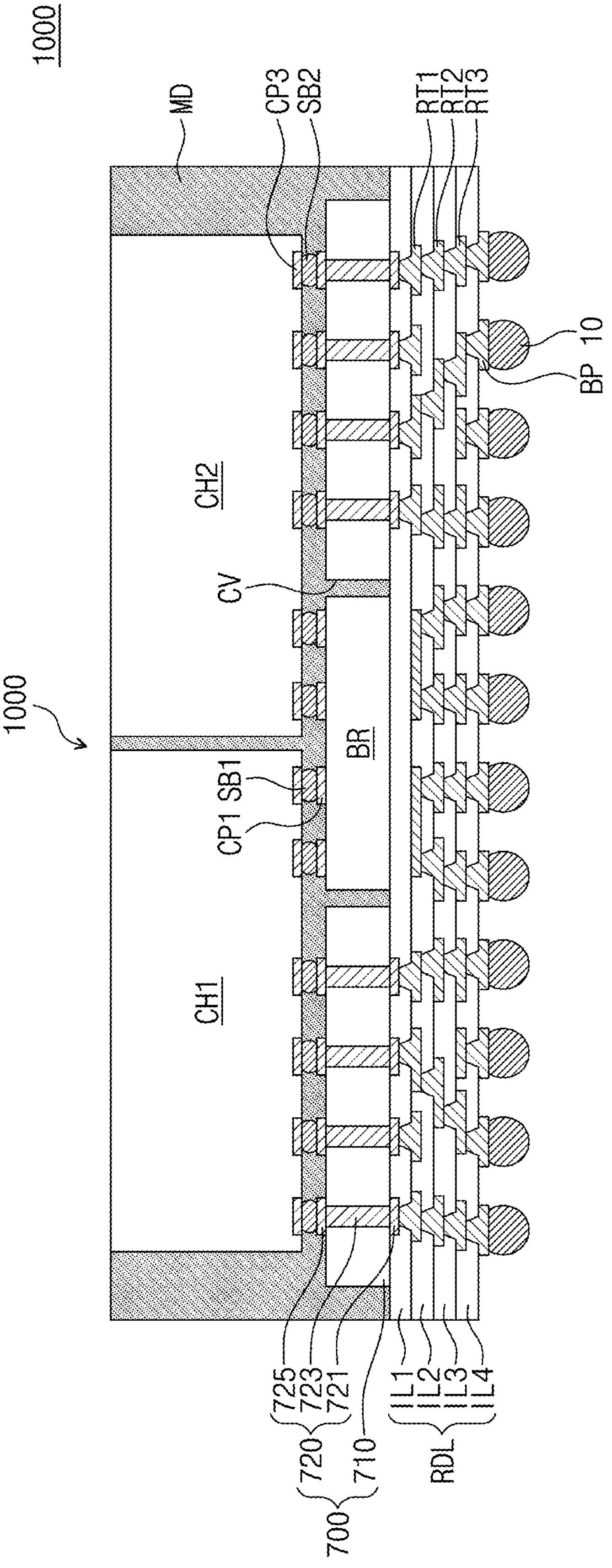

Referring to FIGS. 7G and 7H, a dicing process using laser may be performed to remove the redistribution substrate RDL, the panel frame PF and the mold layer MD of the separation regions SR, thereby manufacturing a semiconductor package 1000. Thus, the semiconductor package 1000 of FIG. 2 may be manufactured.

Figure 8:
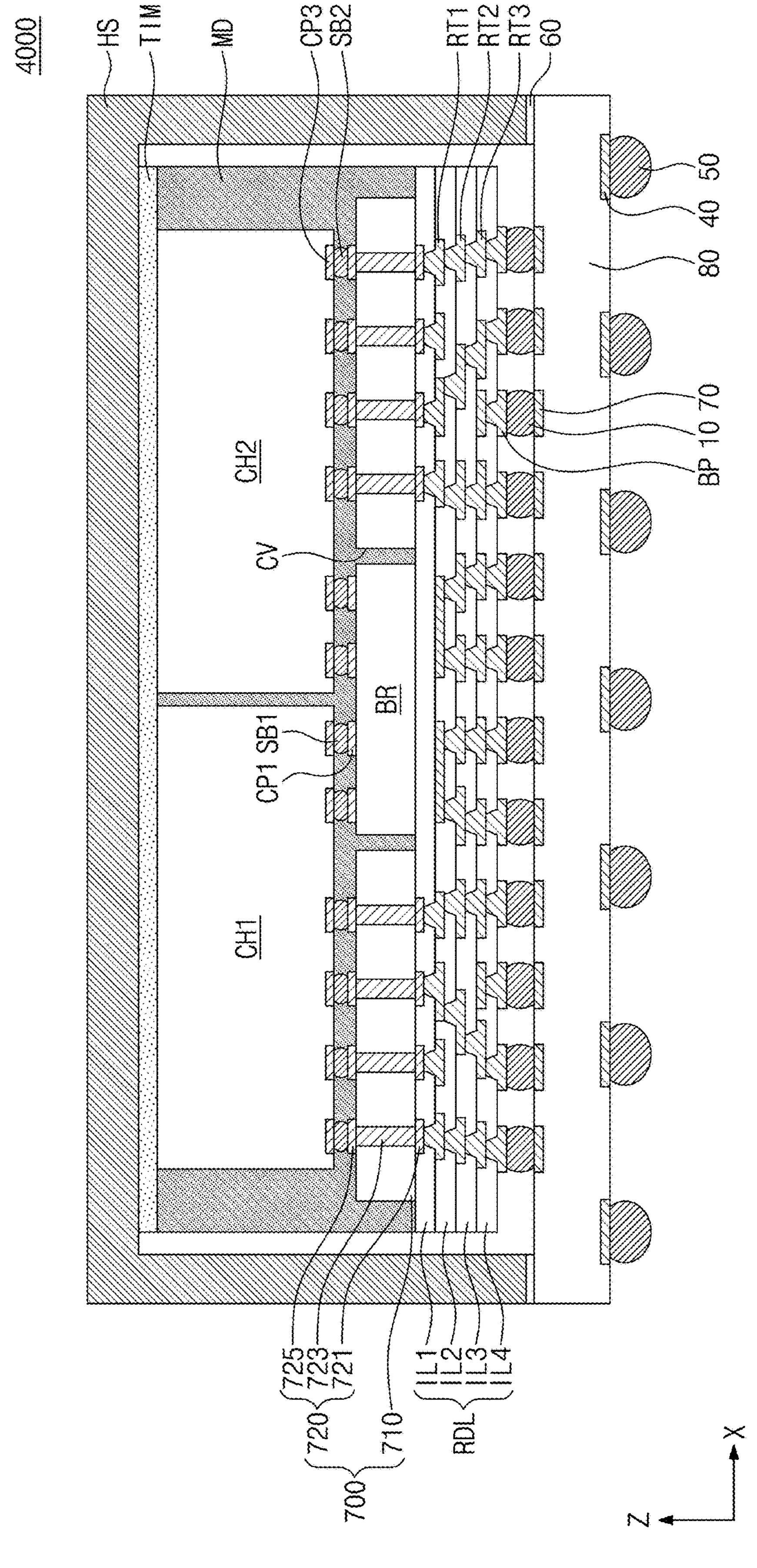
FIG. 8 is a cross-sectional view illustrating a semiconductor package according to some example embodiments of the inventive concepts.

FIG. 8 is a cross-sectional view illustrating a semiconductor package according to some example embodiments of the inventive concepts.

Referring to FIG. 8, a semiconductor package 4000 according to the present example embodiments may include a first substrate 80. For example, the first substrate 80 may be a printed circuit board. Upper substrate pads 70 may be disposed at a top surface of the first substrate 80, and lower substrate pads 40 may be disposed at a bottom surface of the first substrate 80. The semiconductor package 4000 may have a structure in which the semiconductor package 1000 of FIG. 2 is mounted on the first substrate 80. Alternatively, even though not shown in the drawings, the semiconductor package 4000 may have a structure in which one of the semiconductor packages 1001, 2000 and 3000 of FIGS. 4 to 6 is mounted on the first substrate 80. The first external connection terminals 10 may be bonded to the upper substrate pads 70. Second external connection terminals 50 may be bonded to the lower substrate pads 40. Each of the first and second external connection terminals 10 and 50 may include at least one of a solder ball, a conductive bump, or a conductive pillar. The first and second external connection terminals 10 and 50 may include at least one of tin, lead, silver, copper, aluminum, gold, or nickel.

A heat dissipation member HS may be provided to cover a top surface of the first substrate 80, the first and second semiconductor chips CH1 and CH2 and the mold layer MD.

The heat dissipation member HS may include a material having excellent thermal conductivity, for example, a metal or graphene.

A thermal interface material layer TIM may be disposed between the heat dissipation member HS and the mold layer MD, between the heat dissipation member HS and the first semiconductor chip CH1 and between the heat dissipation member HS and the second semiconductor chip CH2. The thermal interface material layer TIM may include a thermosetting resin layer. The thermal interface material layer TIM may further include filler particles dispersed in the thermosetting resin layer. The filler particles may include at least one of silica, alumina, zinc oxide, or nitrogen boride.

An adhesive layer 60 may be disposed between the heat dissipation member HS and the first substrate 80. The adhesive layer 60 may include the same material as the thermal interface material layer TIM. Other components of the semiconductor package 4000 may be the same/similar as described with reference to FIGS. 1 to 5.

In the semiconductor package according to the inventive concepts, the glass substrate including the cavity and the connection vias may be disposed on the redistribution substrate, and the bridge die formed of silicon may be disposed in the cavity. The semiconductor chips may be mounted on the glass substrate and the bridge die, and the mold layer may cover them. The glass substrate may have the thermal expansion coefficient lower than that of the mold layer, and the rigidity higher than that of the mold layer, and thus warpage of the semiconductor package may be prevented or reduced in likelihood. As a result, the semiconductor package with improved durability and reliability may be provided. In addition, since an additional redistribution layer is not formed on the bridge die, the manufacturing cost of the semiconductor package may be effectively reduced.

While the example embodiments of the inventive concepts have been particularly shown and described, it will be understood by one of ordinary skill in the art that variations in form and detail may be made therein without departing from the spirit and scope of the attached claims.

What is claimed is:

1. A semiconductor package comprising:

a redistribution substrate;

a glass substrate mounted on the redistribution substrate and a cavity defined in a central portion of the glass substrate;

a bridge die in the cavity;

a first semiconductor chip and a second semiconductor chip, the first semiconductor chip and the second semiconductor chip are side by side, on the glass substrate, and on the bridge die;

a mold layer covering a top surface of the redistribution substrate, the glass substrate, the bridge die, the first semiconductor chip, and the second semiconductor chip; and internal connection terminals connecting the glass substrate and the bridge die to the first semiconductor chip and the second semiconductor chip, wherein the glass substrate includes a plurality of connection vias, and wherein a distance between an outer side surface of the glass substrate and a side surface of the mold layer ranges from 30 μm to 500 μm.

2. The semiconductor package of claim 1, wherein the redistribution substrate comprises:

a plurality of redistribution insulating layers sequentially stacked; and redistribution patterns between the plurality of redistribution insulating layers, wherein each of at least some of the redistribution patterns includes, a via portion penetrating a corresponding one of the plurality of redistribution insulating layers; and a line portion between corresponding ones of the plurality of redistribution insulating layers.

3. The semiconductor package of claim 2, wherein the plurality of connection vias are electrically connected to corresponding ones of the redistribution patterns of the redistribution substrate.

4. The semiconductor package of claim 2, wherein the redistribution substrate further includes, lower bonding pads on a bottom surface of the redistribution substrate, and the semiconductor package further includes, external connection terminals bonded to the lower bonding pads.

5. The semiconductor package of claim 2, wherein the glass substrate includes, lower conductive pads under the plurality of connection vias, respectively, and wherein an uppermost one of the plurality of redistribution insulating layers is in contact with a bottom surface of the glass substrate and covers side surfaces of the lower conductive pads.

6. The semiconductor package of claim 5, wherein the bridge die includes, lower chip pads on a bottom surface of the bridge die, and wherein the redistribution patterns include, a first redistribution pattern in contact with one of the lower conductive pads, and a second redistribution pattern in contact with one of the lower chip pads.

7. The semiconductor package of claim 1, wherein the glass substrate has a first width in a first direction, and wherein the redistribution substrate has a second width in the first direction, and the second width is greater than the first width.

8. The semiconductor package of claim 1, wherein a thickness of the glass substrate ranges from 50 μm to 500 μm.

9. The semiconductor package of claim 1, wherein a diameter of each of the plurality of connection vias ranges from 5 μm to 50 μm, and wherein a distance between the plurality of connection vias ranges from 5 μm to 50 μm.

10. The semiconductor package of claim 1, wherein a thickness of the bridge die ranges from 90% to 110% of a thickness of the glass substrate.

11. The semiconductor package of claim 1, wherein top surfaces of the first semiconductor chip and the second semiconductor chip are coplanar with a top surface of the mold layer.

12. The semiconductor package of claim 1, wherein a side surface of at least one of the plurality of connection vias has a straight shape, and the side surface of at least one of the plurality of connection vias is perpendicular to a bottom surface of the glass substrate or is inclined.

13. The semiconductor package of claim 1, further comprising:

silicon capacitors between the glass substrate and the bridge die, and the silicon capacitors connected to bottom surfaces of the first semiconductor chip and the second semiconductor chip.

14. The semiconductor package of claim 1 wherein the glass substrate has a thermal expansion coefficient lower than that of the mold layer, and wherein the glass substrate has a rigidity higher than that of the mold layer.

15. A semiconductor package comprising:

a redistribution substrate including, a plurality of redistribution insulating layers sequentially stacked, and redistribution patterns between the plurality of redistribution insulating layers;

a glass substrate mounted on the redistribution substrate and defining a cavity in a central portion of the glass substrate;

a bridge die in the cavity;

a first semiconductor chip and a second semiconductor chip, the first semiconductor chip and the second semiconductor chip are side by side, on the glass substrate, and on the bridge die;

silicon capacitors between the glass substrate and the bridge die, and the silicon capacitors connected to bottom surfaces of the first semiconductor chip and the second semiconductor chip;

a mold layer covering a top surface of the redistribution substrate, the glass substrate, the bridge die, the silicon capacitors, the first semiconductor chip and the second semiconductor chip; and internal connection terminals connecting the glass substrate, the bridge die and the silicon capacitors to the first semiconductor chip and the second semiconductor chip, wherein the glass substrate includes first connection vias, wherein a distance between an outer side surface of the glass substrate and a side surface of the mold layer ranges from 30 μm to 500 μm, wherein a thickness of the glass substrate ranges from 50 μm to 500 μm, wherein a diameter of the first connection vias ranges from 5 μm to 50 μm, wherein a distance between the first connection vias ranges from 5 μm to 50 μm, wherein the glass substrate has a thermal expansion coefficient lower than that of the mold layer, and wherein the glass substrate has a rigidity higher than that of the mold layer.

16. The semiconductor package of claim 15, wherein a thickness of the bridge die ranges from 90% to 110% of the thickness of the glass substrate.

17. The semiconductor package of claim 15, wherein top surfaces of the first semiconductor chip and the second semiconductor chip are coplanar with a top surface of the mold layer.

18. The semiconductor package of claim 15, wherein the bridge die includes a second connection via, and wherein each of the silicon capacitors includes a third connection via.

19. A semiconductor package comprising:

a first substrate;

a redistribution substrate on the first substrate;

a glass substrate on the redistribution substrate and defining a cavity in a central portion of the glass substrate;

a bridge die in the cavity;

a first semiconductor chip and a second semiconductor chip, the first semiconductor chip and the second semiconductor chip are side by side, on the glass substrate, and on the bridge die;

a mold layer covering a top surface of the redistribution substrate, the glass substrate, the bridge die, the first semiconductor chip and the second semiconductor chip;

internal connection terminals connecting the glass substrate and the bridge die to the first semiconductor chip and the second semiconductor chip; and a heat dissipation member covering a top surface of the first substrate, the first semiconductor chip, the second semiconductor chip, and the mold layer, wherein the redistribution substrate includes, a plurality of redistribution insulating layers sequentially stacked, and redistribution patterns between the plurality of redistribution insulating layers, and wherein a distance between an outer side surface of the glass substrate and a side surface of the mold layer ranges from 30 μm to 500 μm.

20. The semiconductor package of claim 19, wherein each of the glass substrate and the bridge die includes a connection via.

* * * * *